United States Patent
Sakamoto

(10) Patent No.: US 8,052,793 B2
(45) Date of Patent: Nov. 8, 2011

(54) METHOD FOR PRODUCING SILICON CARBIDE SINGLE CRYSTAL

(75) Inventor: Hidemitsu Sakamoto, Susono (JP)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 1008 days.

(21) Appl. No.: 11/921,463

(22) PCT Filed: Jun. 16, 2006

(86) PCT No.: PCT/JP2006/312553
§ 371 (c)(1),
(2), (4) Date: Dec. 3, 2007

(87) PCT Pub. No.: WO2006/137500
PCT Pub. Date: Dec. 28, 2006

(65) Prior Publication Data
US 2009/0101062 A1    Apr. 23, 2009

(30) Foreign Application Priority Data

Jun. 20, 2005 (JP) ................. 2005-179412

(51) Int. Cl.
*C30B 15/20* (2006.01)
(52) U.S. Cl. .......................... 117/74; 117/56
(58) Field of Classification Search .............. 117/74, 117/13, 9
See application file for complete search history.

(56) References Cited

FOREIGN PATENT DOCUMENTS

| JP | A 06-219898 | 8/1994 |
|---|---|---|
| JP | A 07-172998 | 7/1995 |
| JP | A 2000-264790 | 9/2000 |
| JP | A 2001-010896 | 1/2001 |
| JP | A 2002-356397 | 12/2002 |
| JP | A 2003-104799 | 4/2003 |
| JP | A 2005-082435 | 3/2005 |

*Primary Examiner* — Bob M Kunemund
*Assistant Examiner* — Irina Kalish
(74) *Attorney, Agent, or Firm* — Oliff & Berridge, PLC

(57) ABSTRACT

A method for producing a silicon carbide single crystal, which comprises bringing a silicon carbide single crystal substrate into contact with a melt prepared by melting a raw material containing Si and C, and growing a silicon carbide single crystal on the substrate, the method including performing a cycle comprising the following steps (a) and (b):

a) a step of bringing the seed crystal substrate into contact with the surface of the melt, growing a single crystal, and separating the seed crystal substrate from the surface of the melt thereby interrupting the growth of the single crystal, and b) a step of bringing the seed crystal substrate into contact with the surface of the melt and growing a single crystal, at least one time, wherein the seed crystal is a 6H-silicon carbide single crystal or a 15R-silicon carbide single crystal and the resulting single crystal is a 4H-silicon carbide single crystal.

6 Claims, 1 Drawing Sheet

METHOD FOR PRODUCING SILICON CARBIDE SINGLE CRYSTAL

TECHNICAL FIELD

The present invention relates to a method which can produce a desired 4H-silicon carbide single crystal by preventing the occurrence of lattice defects.

BACKGROUND ART

Silicon carbide is thermally and chemically very stable and is excellent in heat resistance and mechanical strength, and is therefore used as an environment resistant semiconductor material. It is also known that silicon carbide has a crystalline polytype structure. Crystal polytype is a phenomenon in which crystals have a lot of various structures even in the case of the same chemical composition. Assuming that a molecule obtained by combining Si and C is as one unit in a crystal structure, the crystal polymerization in caused by the fact that a periodic structure in case of laminating this unit structural molecule in the c-axis direction ([0001] direction) of the crystal varies.

Typical crystal polytype includes 2H, 3C, 4H, 6H and 15R. Herein, a first numeral denotes a repeating period of lamination, a letter denotes a crystal system, i.e., H denotes a hexagonal system, R denotes a rhombohedral system, and C denotes a cubic system. The respective crystal structures differ in physical and electrical characteristics and application for various uses is considered utilizing the difference. For example, 4H is used as a substrate wafer of a high frequency and high voltage resistant electric device and also 6H is used as a light emitter material for blue LED because its band gap is so large as about 3 eV. 3C is a semiconductor element material capable of operating at a high speed because of high the symmetric property of a crystal and large mobility of electrons.

Incidentally, as a method for growing a silicon carbide single crystal, for example, a vapor phase growth method, an Acheson method and a solution growth method have conventionally been known.

The vapor phase growth method includes, for example, a sublimation method (improved relay method) and a chemical vapor deposition (CVD method). The sublimation method is a method comprising sublimating a silicon carbide powder as a raw material at a high temperature of 2,000° C. or higher, and supersaturating Si, $Si_2C$ and a $Si_2C$ gas on a seed crystal substrate maintained at a low temperature thereby depositing a single crystal. The CVD method is a method comprising performing epitaxially growing a silicon carbide single crystal on a heated substrate made of Si using a silane gas and a hydrocarbon-based gas, and is used to produce a silicon carbide single crystal.

The Acheson method is a method comprising heating silicic anhydride and carbon to a high temperature of 2,000° C. or higher to produce an artificial abrasive and a single crystal is produced as a by-product.

The solution method is a method comprising melting silicon in a crucible made of a material containing carbon (generally graphite) to give a melt, dissolving carbon from the crucible in the melt, crystallizing silicon carbide on a seed crystal substrate disposed at the low temperature portion, and growing the crystal.

However, it is known that various lattice defects such as a hollow penetrating defect and stacking fault called as micropipe defect are present in the single crystal produced by the above sublimation method. Furthermore, since crystal growth is closely related to polytype transition in the sublimation method, it is difficult to reconcile control of lattice defects and control of polytype transition thereby causing such a problem that crystal polytype is likely to occur.

Also, since a small amount of a raw material is supplied because a raw material is supplied in the form of a gas in the CVD method, and the silicon carbide single crystal to be produced is limited to a thin film and it is difficult to produce a bulk single crystal as a substrate material for device.

In the Acheson method, a large amount of impurities are present in a raw material and it is difficult to enhance purity, and it is also possible to obtain a large size crystal.

On the other hand, in the solution method, since fewer lattice defects exist and also crystal polytype rarely occurs, a single crystal having good crystallinity can be obtained.

A single crystal is produced by growing (laminating) a crystal in a specific direction, and in the vapor phase method such as a sublimation method, a single crystal having a property, which is different from that of a conventional single crystal, grows on the border of certain lamination, namely, transformation of crystal polytype occurs. On the other hand, although transformation of crystal polytype can be prevented in the solution method, the resulting crystal has the same crystal structure as that of a seed crystal and a silicon carbide single crystal having a derived crystal structure cannot be obtained by controlling transformation of crystal polytype regardless of the crystal structure of the seed crystal.

Incidentally, as described above, it is now considered that a 4H-silicon carbide single crystal is suitable for applications related to a device because of its large electron mobility, inhibition band width and electrolysis breakdown, small anisotropy of electrical conduction and comparatively shallow donor or acceptor level. However, a 4H-silicon carbide scarcely exists in a relay crystal (SiC crystal made by a relay method) used as a seed crystal. Also, since the relay crystal is used as a seed crystal in the solution method, it has been difficult to produce a 4H-silicon carbide seed crystal.

An object of the present invention is to solve the above problem and provide a method capable of producing a desired 4H-silicon carbide single crystal from 6H or 15R by transforming a crystal polytype using a 6H-silicon carbide single crystal or a 15R-silicon carbide single crystal as a seed crystal.

DISCLOSURE OF THE INVENTION

To solve the above problem, according to a first aspect of the present invention, a method for producing a silicon carbide single crystal comprises bringing a silicon carbide single crystal substrate into contact with a melt prepared by melting a raw material containing Si and C, and growing a silicon carbide single crystal on the substrate, the method including performing a cycle comprising the following steps (a) and (b):

a) a step of bringing the seed crystal substrate into contact with the surface of the melt, growing a single crystal, and separating the seed crystal substrate from the surface of the melt thereby interrupting the growth of the single crystal, and b) a step of bringing the seed crystal substrate into contact with the surface of the melt and growing a single crystal, at least one time, wherein the seed crystal is a 6H-silicon carbide single crystal or a 15R-silicon carbide single crystal and the resulting single crystal is a 4H-silicon carbide single crystal.

According to the second aspect, as in the first aspect, the raw material contains 3 to 45 atomic % of Al.

According to the third aspect, as in the first aspect, the raw material contains 1 to 20 atomic % of Sn.

According to the fourth aspect, as in the first aspect, the raw material contains 1 to 30 atomic % of Ge.

According to the fifth aspect, as in the first aspect, a temperature of the melt is from a melt point to 2,300° C.

According to the sixth aspect, as in the first aspect, the melt forms a temperature gradient of 10 to 45° C./cm from the inside toward the surface to be contacted with a seed crystal.

BEST MODE FOR CARRYING OUT THE INVENTION

Figure 1:
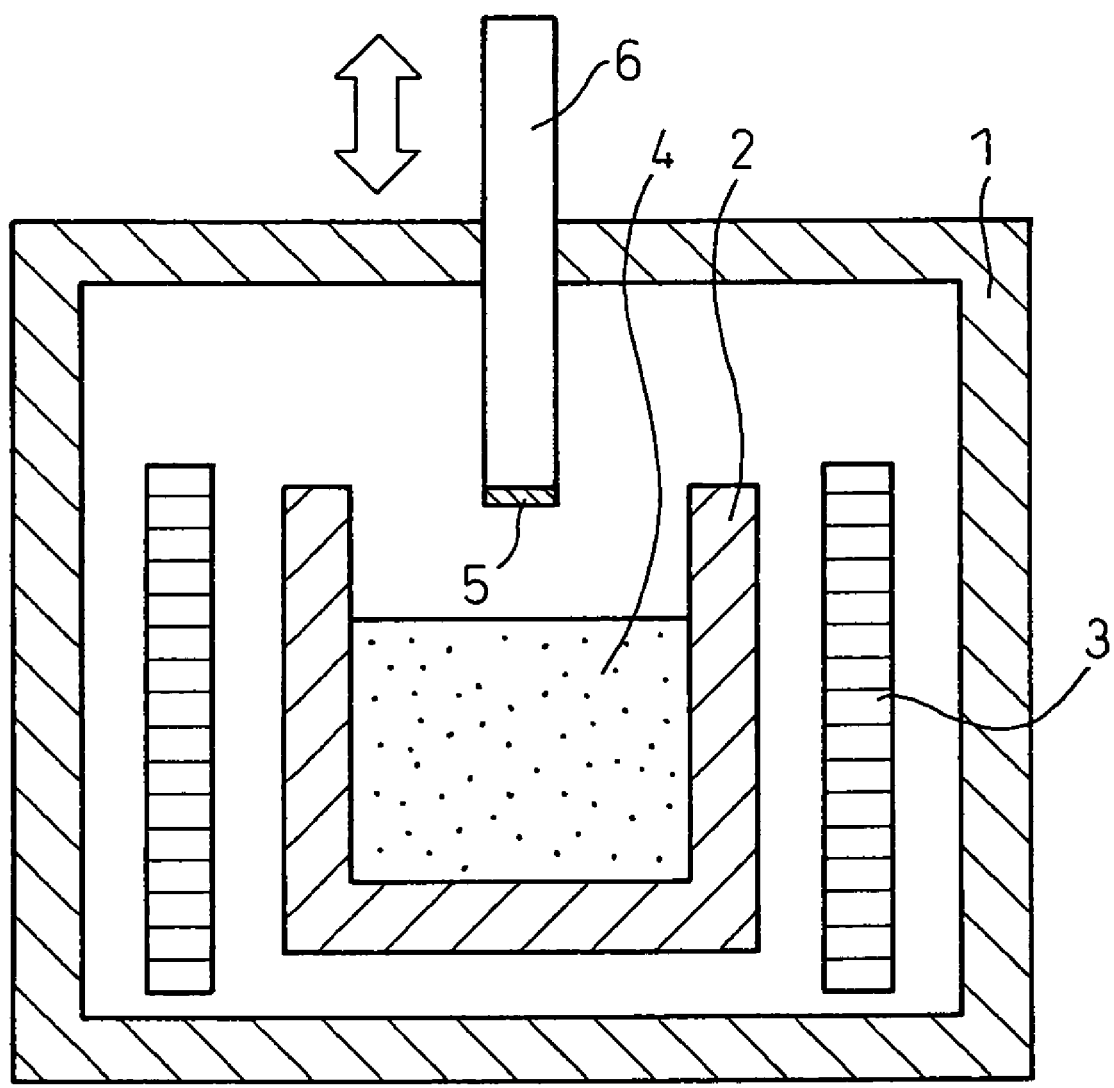
FIG. 1 is a schematic diagram showing the configuration of a production apparatus used in a method for producing a silicon carbide single crystal of the present invention.

The method for producing a silicon carbide single crystal of the present invention will now be described in detail.

First, the configuration of a production apparatus used in the method for producing a silicon carbide single crystal of the present invention will be described with reference to FIG. 1. This production apparatus is equipped with a chamber 1, and a crucible 2 is disposed in camber 1. Crucible 1 is filled with a raw material 4 containing Si and C. When a crucible made of graphite is used as crucible 2, C is melted from crucible 2 and therefore it is not necessary to add C to the raw material. A heating device 3 is disposed around crucible 2 and a seed crystal substrate 5 is disposed at the tip of a pulling rod 6 above crucible 2. A cooling device (not shown) is connected to pulling rod 6 so as to cool seed crystal substrate 5 to a predetermined temperature.

The method for producing a silicon carbide single crystal using this production apparatus will now be described. First, crucible 2 is filled with raw material 4. After chamber 1 is evacuated and filled with an inert gas such as Ar gas, the pressure in chamber 1 is increased to an atmospheric pressure or higher. Raw material 4 is melted by heating crucible 2 by heating device 3 to form a melt containing Si and C. Then, pulling rod 6 is brought into contact with the surface of the melt containing Si and C by lowering the pulling rod. By continuously bringing the pulling rod into contact with the surface of the melt, a single crystal grows on the seed crystal substrate 5 and thus a silicon carbide single crystal can be obtained.

According to a conventional solution method, a crystal was grown by gradually pulling a pulling rod according to the growth of a crystal on a seed crystal substrate while bringing a melt into contact with a seed crystal substrate. The method of the present invention comprises performing a cycle comprising the following steps (a) and (b):

a) a step of bringing the seed crystal substrate into contact with the surface of the melt, growing a single crystal, and separating the seed crystal substrate from the surface of the melt thereby interrupting the growth of the single crystal, and b) a step of bringing the seed crystal substrate into contact with the surface of the melt and growing a single crystal, at least one time, using a 6H-silicon carbide single crystal or a 15R-silicon carbide single crystal as a seed crystal, and performing interruption of crystal growth, one or a number of times.

As described above, crystal polymorphism is transformed by interrupting crystal growth on the way and growing the crystal again to obtain a 4H-silicon carbide single crystal is formed on a substrate made of a 6H-silicon carbide single crystal or a 15R-silicon carbide single crystal substrate as a seed crystal. The reason why polytype transformation is caused by interrupting crystal growth on the way is not clear, but is considered as follows. Namely, by interrupting crystal growth, an unstable crystal is formed on a seed crystal by bringing a seed crystal into contact with a melt to cause a state where polytype transformation is likely to occur, and compressive stress is produced on the surface of the crystal in the growing process by thermal stress in case of bringing the crystal into contact with the melt again, and thus surface energy varies. As a result, rearrangement and stabilization of the crystal are promoted to form 4H as a more stable crystal form, and thus the above stress is relaxed to form a 4H-single crystal. Accordingly, it is considered that interruption of the crystal growth is preferably repeated a number of times. Also, it is preferred to secure an interruption time enough to relax the above stress and the interruption time varies depending on the polytype of the seed crystal. In case of using, as a seed crystal, a 15R crystal whose lamination state is comparatively similar to that of 4H-SiC, the interruption time may be a short time. However, in case of using, as a seed crystal, a 6H crystal whose lamination state is drastically different from that of 4H-SiC, comparatively long interruption time must be secured. Generally, the interruption time is preferably one hour or more, per one time and the interruption number (cycle number) is preferably from 1 to 30.

The temperature of the melt may be a melting point of the raw material or higher so as to secure the state of the melt, and a most stable 4H-silicon carbide single crystal can be obtained at a temperature range of 1,800° C. or higher. Also, the temperature of the melt is preferably 2,300° C. or lower. Because a problem occurs in that Si is drastically vaporized from the melt when the temperature of the melt is higher than 2,3000C. The melt preferably forms a temperature gradient of 10 to 45° C./cm from the inside toward the surface to be contacted with a seed crystal so as to secure a stable crystal grown layer.

Furthermore, Al, Sn or Ge preferably exists in the melt. By adding these elements, a 4H-silicon carbide can be obtained more stably and surface smoothness of the resulting single crystal is improved. The amount of these elements to be added is preferably from 3 to 45 atomic % in case of Al, 1 to 20 atomic % in case of Sn, and 1 to 30 atomic % in case of Ge.

EXAMPLES 1 TO 7

Using an apparatus shown in FIG. 1, a predetermined amount of silicon particles and various additive elements were charged in a crucible and a silicon carbide single crystal was grown under the following conditions shown in Table 1. The results are shown in Table 1 below.

TABLE 1

| | | | Examples | | | | |
|---|---|---|---|---|---|---|---|
| No. | Growth interruption | Melt temperature (° C.) | Temperature gradient (° C./cm) | Metal additive | Polytype of seed crystal | Polytype of grown layer | Growth interruption number | Growth interruption time (hr) |
| 1 | carried out | 1,450 | 20 | Al | 6H—SiC | 4H—SiC | 15 | 28 |
| 2 | carried out | 1,700 | 20 | Al | 6H—SiC | 4H—SiC | 15 | 28 |
| 3 | carried out | 1,700 | 45 | Al | 6H—SiC | 4H—SiC | 15 | 28 |
| 4 | carried out | 1,700 | 45 | Al | 15R-SiC | 4H—SiC | 1 | 1 |
| 5 | carried out | 1,800 | 20 | Sn | 15R-SiC | 4H—SiC | 1 | 1 |
| 6 | carried out | 1,800 | 20 | Ge | 6H—SiC | 4H—SiC | 15 | 28 |
| 7 | carried out | 1,800 | 20 | none | 6H—SiC | 4H—SiC | 15 | 28 |

The polytype of the resulting crystal grown layer was confirmed by a Raman spectrum. As is apparent from the results shown in Table 1, a 4H-silicon carbide single crystal could be formed on the surface of both of a 6H-silicon carbide single crystal and a 15R-silicon carbide single crystal by interrupting the growth in a crystal growth process.

COMPARATIVE EXAMPLES 1 TO 5

In accordance with the method of Examples, crystal growth was continuously performed without interrupting the growth a crystal growth process. The conditions and results are shown in Table 2 below.

TABLE 2

| | | | Comparative Examples | | | |
|---|---|---|---|---|---|---|
| No. | Growth interruption | Melt temperature (° C.) | Temperature gradient (° C./cm) | Metal additive | Polytype of seed crystal | Polytype of grown layer |
| 1 | none | 1,700 | 20 | Al | 6H—SiC | 6H—SiC |
| 2 | none | 1,800 | 20 | Sn | 15R-SiC | 15R-SiC |
| 3 | none | 1,800 | 20 | Ge | 6H—SiC | 6H—SiC |
| 4 | none | 1,800 | 20 | none | 6H—SiC | 6H—SiC |
| 5 | none | 1,800 | 50 | Al | 6H—SiC | 6H—SiC (partially polycrystallized) |

As is apparent from the results shown in Table 2, the seed crystal is not transformed into 4H-silicon carbide under all conditions when the crystal growth is not interrupted, and a crystal having the same polytype as that of the seed crystal used was obtained in almost all cases.

As described above, according to the present invention, a silicon carbide single crystal, which is free from lattice defects such as micropipe defect, can be obtained by growing a crystal in accordance with a solution growth method. Furthermore, a 4H-silicon carbide single crystal can be obtained by transforming a polytype from 6H or 15R heteromorphic seed crystal through interruption of the growth in a crystal growth process.

The invention claimed is:

1. A method for producing a silicon carbide single crystal, which comprises bringing a silicon carbide single crystal substrate into contact with a melt prepared by melting a raw material containing Si and C, and growing a silicon carbide single crystal on the substrate, the method including performing a cycle comprising the following steps (a) and (b):

a) a step of bringing the seed crystal substrate into contact with the surface of the melt, growing a single crystal, and separating the seed crystal substrate from the surface of the melt thereby interrupting the growth of the single crystal, and b) a step of bringing the seed crystal substrate into contact with the surface of the melt and growing a single crystal, at least one time, wherein the seed crystal is a 6H-silicon carbide single crystal or a 15R-silicon carbide single crystal and the resulting single crystal is a 4H-silicon carbide single crystal.

2. The method according to claim 1, wherein the raw material contains 3 to 45 atomic % of Al.

3. The method according to claim 1, wherein the raw material contains 1 to 20 atomic % of Sn.

4. The method according to claim 1, wherein the raw material contains 1 to 30 atomic % of Ge.

5. The method according to claim 1, wherein a temperature of the melt is a melt point or higher of the raw material and 2,300° C. or lower.

6. The method according to claim 1, wherein a temperature of the melt becomes lower from the inside toward the surface to be contacted with a seed crystal thereby forming a temperature gradient of 10 to 45° C./cm.

* * * * *